United States Patent
Hickman

(10) Patent No.: US 9,548,340 B2
(45) Date of Patent: Jan. 17, 2017

(54) AMBIENT AND INFRARED (IR) LIGHT SENSING IN ORGANIC LIGHT EMITTING DIODE (OLED) DISPLAY

(71) Applicant: Bose Corporation, Framingham, MA (US)

(72) Inventor: Mark R. Hickman, Westborough, MA (US)

(73) Assignee: BOSE CORPORATION, Framingham, MA (US)

( * ) Notice: Subject to any disclaimer, the term of this patent is extended or adjusted under 35 U.S.C. 154(b) by 20 days.

(21) Appl. No.: 14/077,401

(22) Filed: Nov. 12, 2013

(65) Prior Publication Data
US 2015/0129841 A1    May 14, 2015

(51) Int. Cl.
*H01L 27/32* (2006.01)

(52) U.S. Cl.
CPC .................................. *H01L 27/3227* (2013.01)

(58) Field of Classification Search
CPC ............. H01L 51/0545; H01L 51/0036; H01L 27/3227; B82Y 10/00
See application file for complete search history.

(56) References Cited

U.S. PATENT DOCUMENTS

| | | | |
|---|---|---|---|
| 2010/0102229 A1* | 4/2010 | Klinghult et al. | 250/338.1 |
| 2010/0102230 A1* | 4/2010 | Chang et al. | 250/338.4 |
| 2010/0237374 A1* | 9/2010 | Chu | H01L 27/3227 257/98 |
| 2012/0170284 A1* | 7/2012 | Shedletsky | G02F 1/13318 362/355 |
| 2014/0152632 A1* | 6/2014 | Shedletsky et al. | 345/207 |
| 2014/0183342 A1* | 7/2014 | Shedletsky et al. | 250/215 |

OTHER PUBLICATIONS

For the American Heritage Dictionary definition: around. (n.d.) American Heritage® Dictionary of the English Language, Fifth Edition. (2011). Retrieved Oct. 6, 2015 from http://www.thefreedictionary.com/around.*
For the American Heritage Dictionary definition: fabricating. (n.d.) American Heritage® Dictionary of the English Language, Fifth Edition. (2011). Retrieved Oct. 8, 2015 from http://www.thefreedictionary.com/fabricating.*

* cited by examiner

*Primary Examiner* — John P Dulka
*Assistant Examiner* — Charles R Peters
(74) *Attorney, Agent, or Firm* — Lando & Anastasi, LLP

(57) ABSTRACT

A method and apparatus for an OLED display system is presented. A substrate is provided and a display is provided on the substrate. At least one sensor is also provided on the substrate. A barrier is provided on the substrate between the display and said the least one sensor, the barrier blocking emissions from the display from being sensed by the at least one sensor.

18 Claims, 5 Drawing Sheets

AMBIENT AND INFRARED (IR) LIGHT SENSING IN ORGANIC LIGHT EMITTING DIODE (OLED) DISPLAY

BACKGROUND

This disclosure relates to Organic Light Emitting Diode (OLED) display systems used in conjunction with Infrared (IR) sensors and/or ambient light sensors.

SUMMARY

An OLED is a light-emitting diode (LED) in which the emissive electroluminescent layer is a film of organic compound which emits light in response to an electric current. As used in this description, an organic compound is any member of a large class of gaseous, liquid, or solid chemical compounds whose molecules contain carbon. This layer of organic semiconductor is situated between two electrodes. Generally, at least one of these electrodes is transparent. OLEDs are used to create digital displays in devices such as television screens, computer monitors, portable systems such as mobile phones, handheld game consoles, Personal Digital Assistants (PDAs) and the like.

An OLED display works without a backlight. Thus, it can display deep black levels and can be thinner and lighter than a Liquid Crystal Display (LCD). In low ambient light conditions such as a dark room an OLED screen can achieve a higher contrast ratio than an LCD, whether the LCD uses cold cathode fluorescent lamps or LED backlight.

A problem associated with OLED displays is brightness and lifetime. It is undesirable to run an OLED display bright all the time. A display for a product may include an OLED display as well as LEDs (power), Infrared (IR) sensors and ambient light sensors.

OLED material, illuminating in a given spectrum, will also absorb photons of somewhat shorter wavelength than that which is emitted. The shorter wavelength, which represents higher energy, is required due to the nature of photon emission and absorption in OLED material. The photon must have enough energy to not only create the "exciton" molecule, a special polarization of the polymer representing a higher electron energy level, but to disassociate the exciton into a free electron and hole pair at the diode junction.

Though the efficient emission and absorption of photons lead to different optimizations of the OLED material the two functions can coexist on the same substrate. When combined on the same substrate a barrier between the illuminating portion and the sensing portion should be used to quench edge-emitted photons form the illuminated area prior to entering the detection material.

Note that each of the different features, techniques, configurations, etc. discussed in this disclosure can be executed independently or in combination. Accordingly, the present invention can be embodied and viewed in many different ways. Also, note that this summary section herein does not specify every embodiment and/or incrementally novel aspect of the present disclosure or claimed invention. Instead, this summary only provides a preliminary discussion of different embodiments and corresponding points of novelty over conventional techniques. For additional details, elements, and/or possible perspectives (permutations) of the invention, the reader is directed to the Detailed Description section and corresponding figures of the present disclosure as further discussed below.

BRIEF DESCRIPTION OF THE DRAWINGS

The foregoing will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Figure 1:
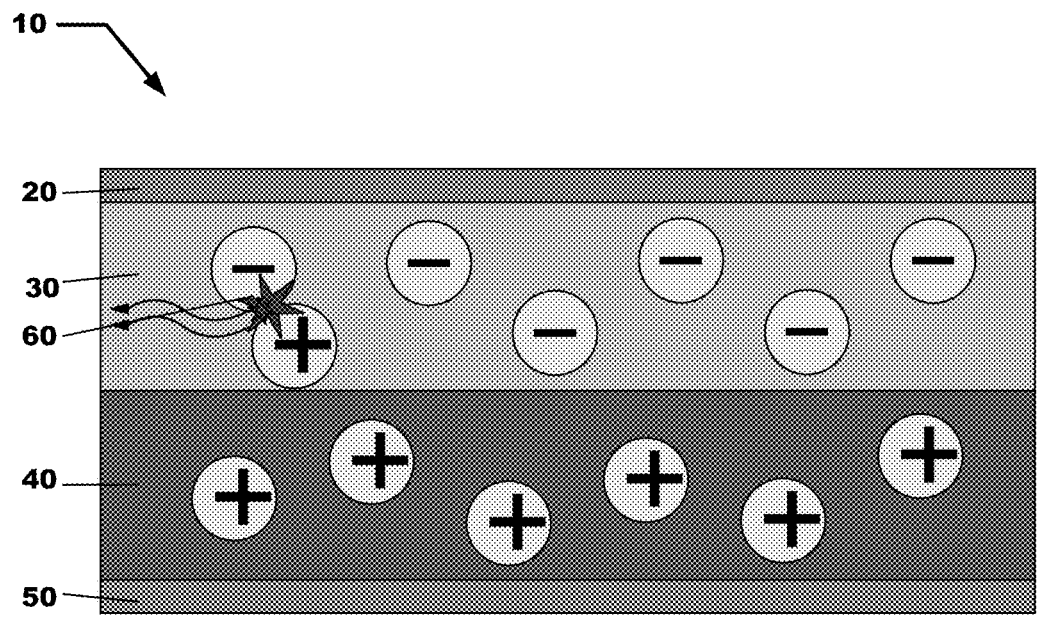
FIG. 1 depicts a schematic of a conventional OLED.

The embodiments set forth below represent the necessary information to enable those skilled in the art to practice the invention and illustrate the best mode of practicing embodiments of the invention. Upon reading the following description in light of the accompanying figures, those skilled in the art will understand the concepts of the invention and recognize applications of these concepts not particularly addressed herein. It should be understood that these concepts and applications fall within the scope of the disclosure and the accompanying claims.

The preferred embodiment of the invention will now be described with reference to the accompanying drawings. The invention may, however, be embodied in many different forms and should not be construed as limited to the embodiment set forth herein; rather, this embodiment is provided so that this disclosure will be thorough and complete, and will fully convey the scope of the invention to those skilled in the art. The terminology used in the detailed description of the particular embodiment illustrated in the accompanying drawings is not intended to be limiting of the invention. In the drawings, like numbers refer to like elements.

Referring to FIG. 1, a typical OLED 10 is shown. OLED 10 includes a cathode layer 20 in electrical and mechanical communication with an organic emissive layer 30. Emissive layer 30 is in mechanical and electrical communication with a conductive layer 40. Conductive layer 40 is in mechanical and electrical communication with anode 50. An emission of radiation 60 is also shown in emissive layer 30.

The organic molecules are electrically conductive as a result of delocalization of pi electrons caused by conjugation over all or part of the molecule. These materials have conductivity levels ranging from insulators to conductors, and therefore are considered organic semiconductors. The highest occupied and lowest unoccupied molecular orbitals (HOMO and LUMO) of organic semiconductors are analogous to the valence and conduction bands of inorganic semiconductors.

During operation, a voltage is applied across the OLED such that the anode 50 is positive with respect to the cathode 20. Anodes are picked based upon the fact of how good their optical transparency, electrical conductivity, and chemical stability are. A current of electrons flows through the device from cathode 20 to anode 50, as electrons are injected into the LUMO of the organic layer at the cathode and withdrawn from the HOMO at the anode. This latter process may also be described as the injection of electron holes into the HOMO. Electrostatic forces bring the electrons and the holes towards each other and they recombine forming an exciton, a bound state of the electron and hole. This happens closer to the emissive layer 30, because in organic semiconductors holes are generally more mobile than electrons. The decay of this excited state results in a relaxation of the energy levels of the electron, accompanied by emission of radiation whose frequency is in the visible region. The frequency of this radiation depends on the band gap of the material, in this case the difference in energy between the HOMO and LUMO.

As electrons and holes are fermions with half integer spin, an exciton may either be in a singlet state or a triplet state depending on how the spins of the electron and hole have been combined. Statistically three triplet excitons will be formed for each singlet exciton. Decay from triplet states (phosphorescence) is spin forbidden, increasing the timescale of the transition and limiting the internal efficiency of fluorescent devices. Phosphorescent organic light-emitting diodes make use of spin-orbit interactions to facilitate intersystem crossing between singlet and triplet states, thus obtaining emission from both singlet and triplet states and improving the internal efficiency.

Indium tin oxide (ITO) is commonly used as the anode material. It is transparent to visible light and has a high work function which promotes injection of holes into the HOMO level of the organic layer. A typical conductive layer may consist of poly(3,4-ethylenedioxythiophene) poly(styrenesulfonate) PEDOT:PSS as the HOMO level of this material generally lies between the workfunction of ITO and the HOMO of other commonly used polymers, reducing the energy barriers for hole injection. Metals such as barium and calcium are often used for the cathode as they have low work functions which promote injection of electrons into the LUMO of the organic layer.

The emissive layer 30 may be a phosphor material that OLED displays use to emit photons and which can also absorb photons. For a display, the phosphor material used is a relatively thin layer such that there is a low chance of re-absorption of the photons, while the phosphor layer for a detector is relatively thicker when compared to the phosphor layer for the emitter. For a photo diode a thicker emulsion of phosphor is preferred so that there is a higher probability that a photon traveling through the phosphor will get absorbed and converted into electrical current.

Though the efficient emission and absorption of photons lead to different optimizations of the OLED material the two functions can coexist on the same substrate. When combined on the same substrate a barrier between the illuminating portion and the sensing portion should be used to quench edge-emitted photons formed in the illuminated area prior to entering the detection material.

Figure 2:
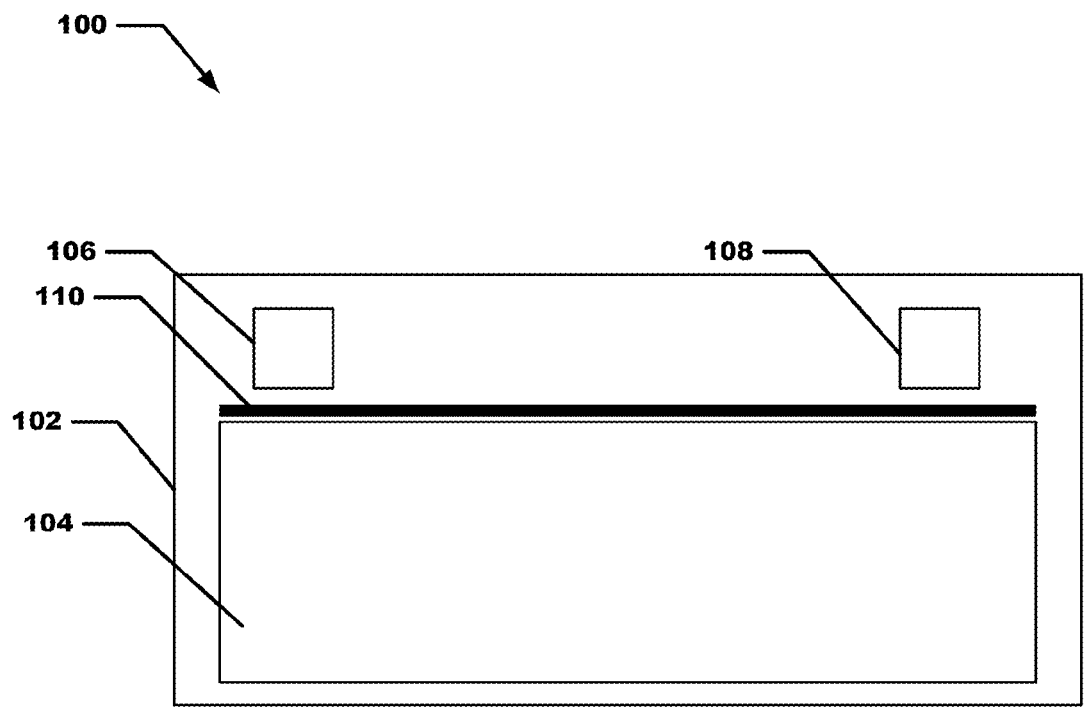
FIG. 2 depicts a block diagram of a first OLED display system in accordance with a particular embodiment of the present invention.

Referring now to FIG. 2, a particular embodiment of an OLED display system 100 including one or more sensors is shown. While an OLED display is described, it should be appreciated that other types of displays could also be used, and the present invention should not be limited to only OLED displays. A substrate 102, larger than the display area, is shown having a OLED display 104 disposed thereon. The substrate may be realized as a flexible substrate in certain embodiments. Also shown disposed on the substrate 102 are an IR sensor 106 and an ambient light sensor 108. In a particular embodiment a layer of phosphor is deposited that is tuned to an appropriate wavelength to absorb visible light and functions as a visible light detector, thus there is no need for a discrete light detector. Similarly, a layer of phosphor is deposited that is tuned to an appropriate wavelength to absorb infrared light and functions as an infrared visible light detector, thus there is no need for a discrete infrared light detector.

The display and sensors can be fabricated as part of the same fabrication process, alternately the display and sensors can be fabricated separately. By fabricating the various parts on the same substrate there is no need for individual components to be used, resulting in a savings of time, parts and labor. As a result, the OLED display can be placed along a front surface of a device without additional optical filters to obscure the presence of the detectors from the user. This permits a reduction in intensity and a concomitant increase in lifetime of the display to be achieved, as compared to conventional arrangements wherein the OLED display is displaced from a front surface of a device due to the inclusion of discrete sensors or other indicators (e.g., power, signal strength, and the like) and the optical filter.

An ambient light sensor 108 is used for products that have a function (e.g., a clock function) that is on all the time, and it is desirable not to have the function to be bright at night as it can be distracting to people. The ambient light can be measured and the brightness of the OLED display adjusted accordingly. An IR sensor 106 is typically used for remote control functions.

A problem associated with providing the OLED display together with a sensor is that the sensor may react to emissions (e.g., edge emitted photons) from the display. In order to overcome this deficiency, a barrier 110 is fabricated between the OLED display 104 and the sensors 106 and 108, the barrier blocking emissions from the OLED display from being sensed by the sensor. In a particular embodiment the barrier comprises a polymer material, such as an opaque material or carbon black material.

Figure 3:
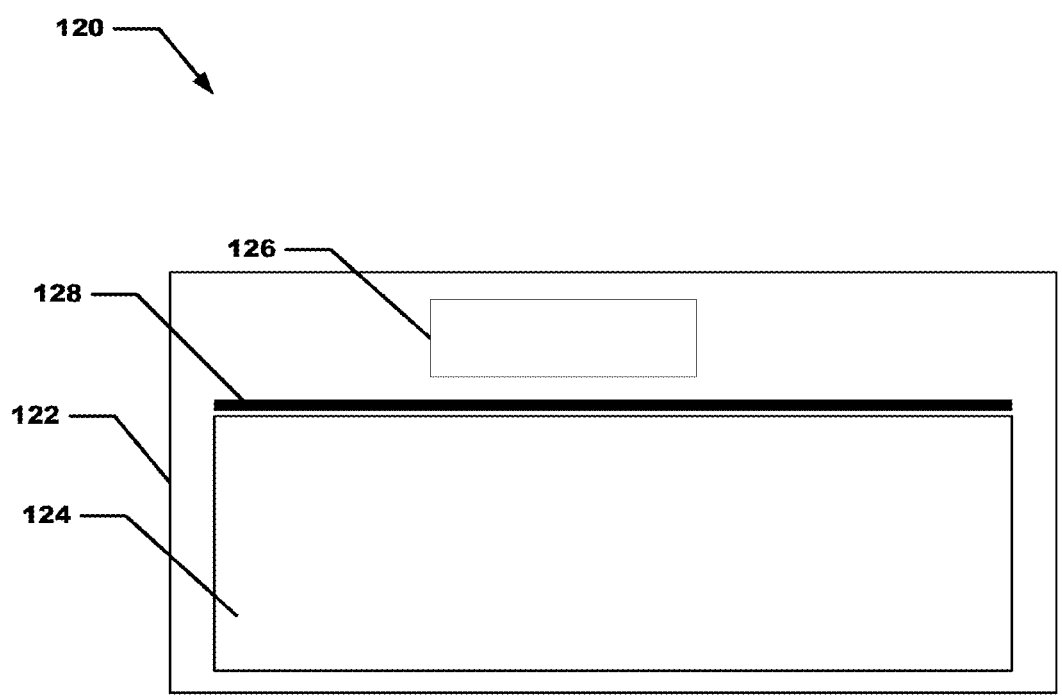
FIG. 3 depicts a block diagram of a second OLED display system in accordance with a particular embodiment of the present invention.

Referring now to FIG. 3, an embodiment of an OLED display system 120 is shown. A substrate 122, larger than the display area, is shown having a OLED display 124 disposed thereon. Also shown disposed on the substrate 122 is a combination sensor 126. The combination sensor 126 comprises an IR sensor and an ambient light sensor. The combination sensor 126 is a phosphor based sensor and the phosphor is tuned to absorb both visible light, infrared light and light between infrared and the visible light. Rather than have a phosphor sensor that is tuned to two distinct frequencies (visible and infrared) a phosphor sensor is used that react to all light between the infrared and the particular frequency of visible light.

Figure 4:
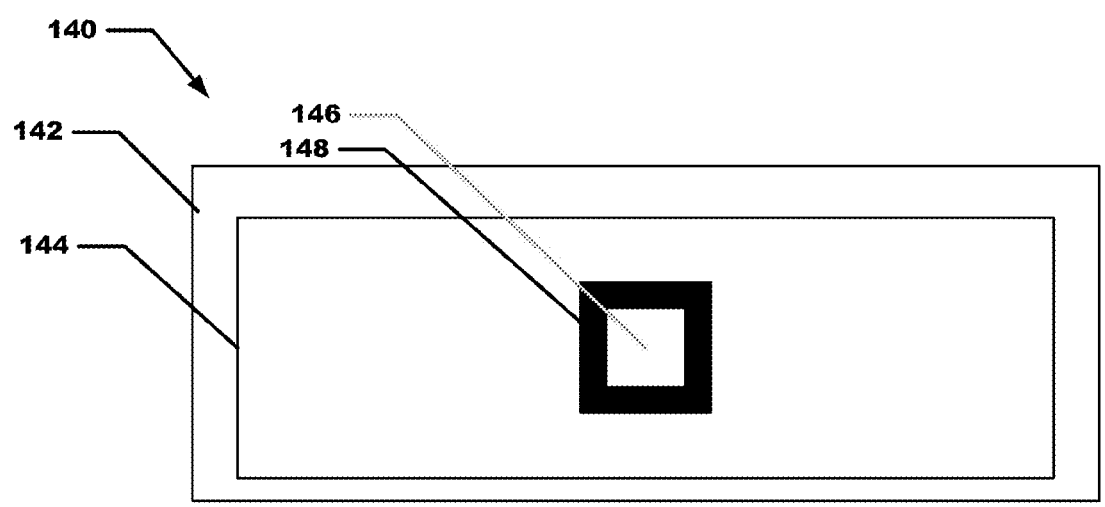
FIG. 4 depicts a block diagram of a third OLED display system in accordance with a particular embodiment of the present invention.

Referring now to FIG. 4, another embodiment 140 is shown. A substrate 142, larger than the display area, is shown having a OLED display 144 disposed thereon. Here, the display 144 surrounds a sensor 146. The barrier 148 is disposed completely around the sensor 146 to prevent the sensor from detecting emissions from display 144.

Figure 5:
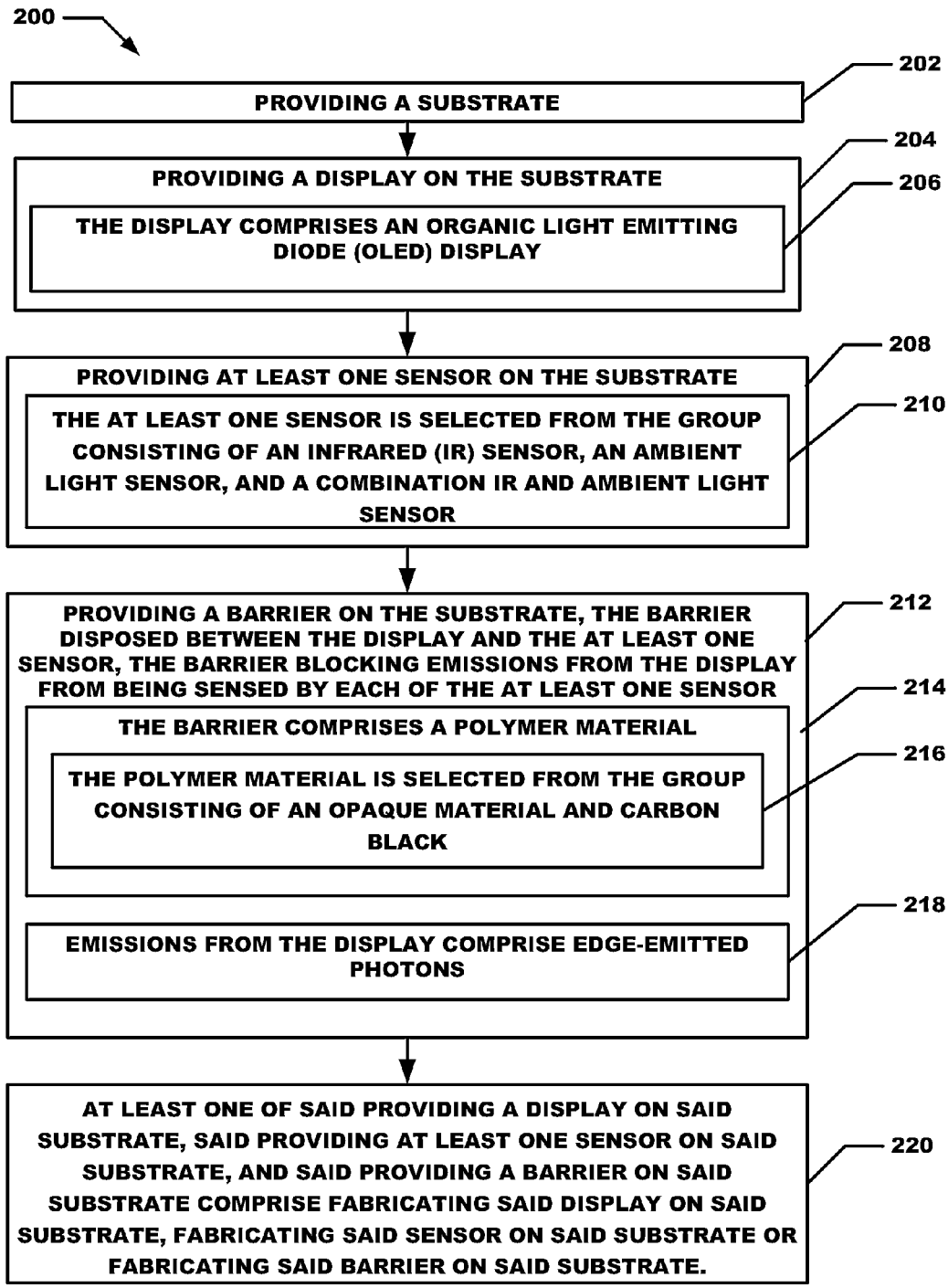
FIG. 5 depicts a block diagram of a particular embodiment of a method for providing an OLED display system in accordance with a particular embodiment of the present invention.

A flow chart of a particular embodiment of the presently disclosed method for providing an OLED display system is depicted in FIG. 5. The rectangular elements are herein denoted "processing blocks" and represent computer software instructions or groups of instructions. Alternatively, the processing blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits to perform the processing required in accordance with the present invention. It should be noted that many routine program elements, such as initialization of loops and variables and the use of temporary variables are not shown. It will be appreciated by those of ordinary skill in the art that unless otherwise indicated herein, the particular sequence of steps described is illustrative only and can be varied without departing from the spirit of the invention. Thus, unless otherwise stated the steps described below are unordered meaning that, when possible, the steps can be performed in any convenient or desirable order.

Referring now to FIG. 5, a particular embodiment of a method 200 for producing a circuit having a display and one or more sensors is shown. Method 200 begins with processing block 202 which discloses providing a substrate. The substrate has a physical size larger than the display and is used as a base for fabricating the display and one or more sensors. In certain embodiments the substrate may comprise a flexible substrate.

Processing block 204 discloses providing a display on the substrate. In a particular embodiment, as shown in processing block 206, the display comprises an Organic Light Emitting Diode (OLED) display. An OLED is a light-emitting diode (LED) in which the emissive electroluminescent layer is a film of organic compound which emits light in response to an electric current.

Processing block 208 states providing at least one sensor on the substrate. As further shown in processing block 210, the at least one sensor is selected from the group consisting of an Infrared (IR) sensor, an ambient light sensor, and a combination IR and ambient light sensor. In a particular embodiment the visible light sensor comprises a layer of phosphor that is deposited that is tuned to an appropriate wavelength to absorb visible light. The infrared sensor comprises a layer of phosphor that is deposited that is tuned to an appropriate wavelength to absorb infrared light. The combination visible light and IR sensor is a phosphor based sensor wherein the phosphor is tuned to absorb both visible light, infrared light and the light between the desired frequency of visible light and IR light.

Processing continues with processing block 212 which recites providing a barrier on the substrate, the barrier disposed between the display and the at least one sensor, the barrier blocking emissions from the display from being sensed by each of the at least one sensor. As shown in processing block 214 the barrier comprises a polymer material. As further shown in processing block 216 the polymer material is selected from the group consisting of an opaque material and carbon black. Processing block 218 discloses wherein the emissions from the display comprise edge-emitted photons.

Processing block 220 states wherein at least one of the providing a display on the substrate, the providing at least one sensor on the substrate, and the providing a barrier on the substrate comprise fabricating the display on the substrate, fabricating the sensor on the substrate or fabricating the barrier on the substrate.

Throughout the entirety of the present disclosure, use of the articles "a" or "an" to modify a noun may be understood to be used for convenience and to include one, or more than one of the modified noun, unless otherwise specifically stated.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

Having described preferred embodiments of the invention it will now become apparent to those of ordinary skill in the art that other embodiments incorporating these concepts may be used. Accordingly, it is submitted that that the invention should not be limited to the described embodiments but rather should be limited only by the spirit and scope of the appended claims.

What is claimed is:

1. An apparatus comprising:
   a substrate;
   a display disposed on said substrate;
   at least one sensor disposed on said substrate; and
   an optically opaque barrier disposed between said display and said at least one sensor, said barrier being a contiguous barrier extending adjacent an entirety of an edge of said display, said barrier displaced from said edge of said display and disposed between said display and said sensor, said barrier blocking emissions from said display from being sensed by said at least one sensor.

2. The apparatus of claim 1 wherein said display comprises an Organic Light Emitting Diode (OLED) display.

3. The apparatus of claim 1 wherein said barrier comprises one of a polymer material and a carbon black material.

4. The apparatus of claim 1 wherein said at least one sensor comprises an InfraRed (IR) sensor.

5. The apparatus of claim 4 wherein said at least one sensor further comprises an ambient light sensor separated from the IR sensor.

6. The apparatus of claim 5 wherein the IR sensor is laterally displaced from the ambient light sensor.

7. The apparatus of claim 1 wherein said at least one sensor comprises a combination InfraRed (IR) and ambient light sensor.

8. The apparatus of claim 1 wherein said at least one sensor is laterally displaced from said display on said substrate.

9. The apparatus of claim 1 wherein said substrate has an area greater than a display area of said display.

10. A method of fabricating a device, the method comprising:
    providing a substrate;
    providing a display including a light emitting portion on said substrate;
    providing at least one sensor on said substrate, said at least one sensor surrounded by the light emitting portion;
    providing a barrier on said substrate, said barrier surrounding said at least one sensor and disposed between said at least one sensor and said light emitting portion, said barrier blocking emissions from said display from being sensed by said at least one sensor; and
    providing an aperture in said barrier over said at least one sensor,
    wherein said device is formed without optical filters that obscure the presence of the at least one sensor from a user.

11. The method of claim 10 wherein said display comprises an Organic Light Emitting Diode display.

12. The method of claim 10 wherein said at least one sensor is selected from the group consisting of an Infrared (IR) sensor, an ambient light sensor, and a combination IR and ambient light sensor.

13. The method of claim 10 wherein said barrier comprises a polymer material.

14. The method of claim 13 wherein said polymer material includes one of an opaque material and carbon black.

15. The method of claim 10 wherein at least one of said providing a display on said substrate, said providing at least one sensor on said substrate, and said providing a barrier on said substrate comprise fabricating said display on said substrate, fabricating said sensor on said substrate or fabricating said barrier on said substrate.

16. An apparatus comprising:

a substrate;

a display including a light emitting portion disposed on said substrate, said substrate having a greater surface area than said display in a plane parallel to a front face of the display;

at least one sensor disposed on said substrate, said light emitting portion surrounding said sensor;

a barrier disposed between said light emitting portion and said at least one sensor, said barrier blocking emissions from said display from being sensed by said at least one sensor; and an aperture defined in said barrier over said at least one sensor.

17. The apparatus of claim 16, wherein said barrier completely surrounds said at least one sensor.

18. The apparatus of claim 16 wherein the apparatus does not include optical filters that obscure the presence of the at least one sensor from a user.

* * * * *